(12) United States Patent
Hui

(10) Patent No.: US 7,167,697 B2
(45) Date of Patent: Jan. 23, 2007

(54) REVERSE ELECTRONIC TUNING CIRCUIT FOR FM RADIO FREQUENCY-LOCK-LOOP CIRCUITS

(75) Inventor: Man Shan Hui, Hong Kong (CN)

(73) Assignee: OneWorld Enterprises Limited, Hong Kong (HK)

( * ) Notice: Subject to any disclaimer, the term of this patent is extended or adjusted under 35 U.S.C. 154(b) by 433 days.

(21) Appl. No.: 10/857,778

(22) Filed: May 28, 2004

(65) Prior Publication Data

US 2005/0096003 A1    May 5, 2005

Related U.S. Application Data

(60) Provisional application No. 60/517,055, filed on Nov. 3, 2003.

(51) Int. Cl.
H04B 1/16 (2006.01)
(52) U.S. Cl. ............................... 455/161.1; 455/164.2; 455/169.1
(58) Field of Classification Search ............. 455/161.1, 455/161.2, 161.3, 162.1, 163.1, 164.1, 164.2, 455/165.1, 166.1, 166.2, 167.1, 168.1, 169.1, 455/169.2
See application file for complete search history.

(56) References Cited

U.S. PATENT DOCUMENTS 3,384,826 A    5/1968    Schurig 3,840,820 A    10/1974   Kawada
3,986,154 A *  10/1976   Yamada et al. ............... 334/15
2003/0013424 A1 * 1/2003  Adrain .................... 455/161.1

OTHER PUBLICATIONS

Product Description, TDA7088T, FM receiver circuit for battery supply, Konninklijke Phillips Electronics N.V.*
Integrated Circuits, Data Sheet TDA7088T FM Receiver Circuit for Battery Supply; Philips Semiconductors, May 1996; pp. 1-15.
SC1088, FM Receiver Circuit for Battery Supply; HangZhou Silan Microelectronics Joint-Stock Co., Ltd.; Silan Semiconductors, pp. 1-7.
Philips Semiconductor: "TDA7088T FM Reciever Circuit for Battery Supply", http://www.semiconductors.philips.com/acrobat_download/datasheets/TDA7088T_2.pdf, May 14, 1996.

* cited by examiner

Primary Examiner—Edward F. Urban
Assistant Examiner—Blane J. Jackson
(74) Attorney, Agent, or Firm—Darby & Darby

(57) ABSTRACT

An electronic circuit having reverse scan tuning comprises an IC radio having the forward scan function, in which a VCO capacitor is connected in parallel to a series connected resistor and switch, and a second switch is connects an input to an IF limiter amplifier to either circuit ground or a voltage supply. The invention makes it convenient for a user to search for a radio station by not having to start a search for a lower band station at the lowest end of the frequency band. The user does not need to push reset button to return to the lowest frequency when the user wants to receive a station whose frequency is lower than the current station.

10 Claims, 3 Drawing Sheets

REVERSE ELECTRONIC TUNING CIRCUIT FOR FM RADIO FREQUENCY-LOCK-LOOP CIRCUITS

CLAIM OF PRIORITY

This application claims the benefit of priority under 35 U.S.C. § 119(e) to U.S. Provisional Application No. 60/517,055, filed Nov. 3, 2003, titled "ELECTRONIC CIRCUIT THAT FACILITATES REVERSE SCAN TUNING IN COMBINATION WITH FM FREQUENCY LOCK LOOP (FLL) CIRCUITS," hereby incorporated by reference in its entirety.

FIELD OF INVENTION

The present invention relates to FM radios integrated into a single IC chip, and more particularly to electronic frequency scanning circuitry for integrated FM radios. Specifically to frequency scanning circuitry which permits forward and reverse frequency scanning of an integrated FM radio.

BACKGROUND OF THE INVENTION

With the development of integrated circuits (IC), both AM and FM radio circuits have been integrated into one chip. Conventional radio chips with a frequency scan function implement a frequency-lock-loop in a manner to achieve only a forward (i.e., band-up) electronic tuning function. Such a scan function drives the radio chip, starting at its presently tuned frequency, to a higher frequency by increasing the radio's intermediate frequency. The scan function stops at the next higher transmitting station frequency that is detected and received by the IC radio.

To tune to a station transmitting on a lower frequency a user must perform a complicated process. First, the user must press a reset button which causes the front end of the radio to tune its intermediate frequency for reception of the lowest frequency in the band. Then the user must press the scan button to cause the receiver to increase its intermediate frequency. The tuning will stop at the next received up-band station. Should a user desire to hear a station transmitting at a yet higher frequency, the scan button must be repetitively pressed until the desired station is reached. If the desired station is at the high end of the band, this process can be especially long, drawn out and frustrating to the user. Particularly, if the user begins this complicated process from a station with a frequency slightly up-band from the desired station's frequency.

Missing from the art is an electronic tuning circuit for IC radios which implements a reverse (band-down) search tuning ability. The present invention can satisfy this need.

SUMMARY OF THE INVENTION

The present invention relates to electronic tuning circuits that add reverse scan (band-down) capability to an integrated circuit FM radio.

In accordance with one aspect of the invention, an electronic circuit capable of reverse tuning an integrated circuit radio comprises a monolithic integrated circuit radio, with a capacitor interconnecting a voltage power source and the automatic frequency control output of the integrated circuit, with a series connected resistor and switch connected across the capacitor, and a second switch interconnecting an input to an intermediate frequency limiter amplifier of the integrated circuit with either circuit ground or the voltage power source.

These and other aspects, features, steps and advantages can be further appreciated from the accompanying drawing Figures and description of certain illustrative embodiments.

BRIEF DESCRIPTION OF THE DRAWING FIGURES

DETAILED DESCRIPTION OF THE ILLUSTRATIVE EMBODIMENTS

By way of overview and introduction, presented and described are embodiments of electronic tuning circuits having reverse scan (band-down) capability which enable an IC radio to implement the reverse scan function. The reverse scan function of the present invention is achieved by incorporating the embodiments of the electronic tuning circuit with known IC radios. The following paragraphs describe embodiments of the invention which are implemented in an IC FM radio. However, the invention is equally applicable to only IC AM radios, and IC AM/FM radios.

Figure 4:
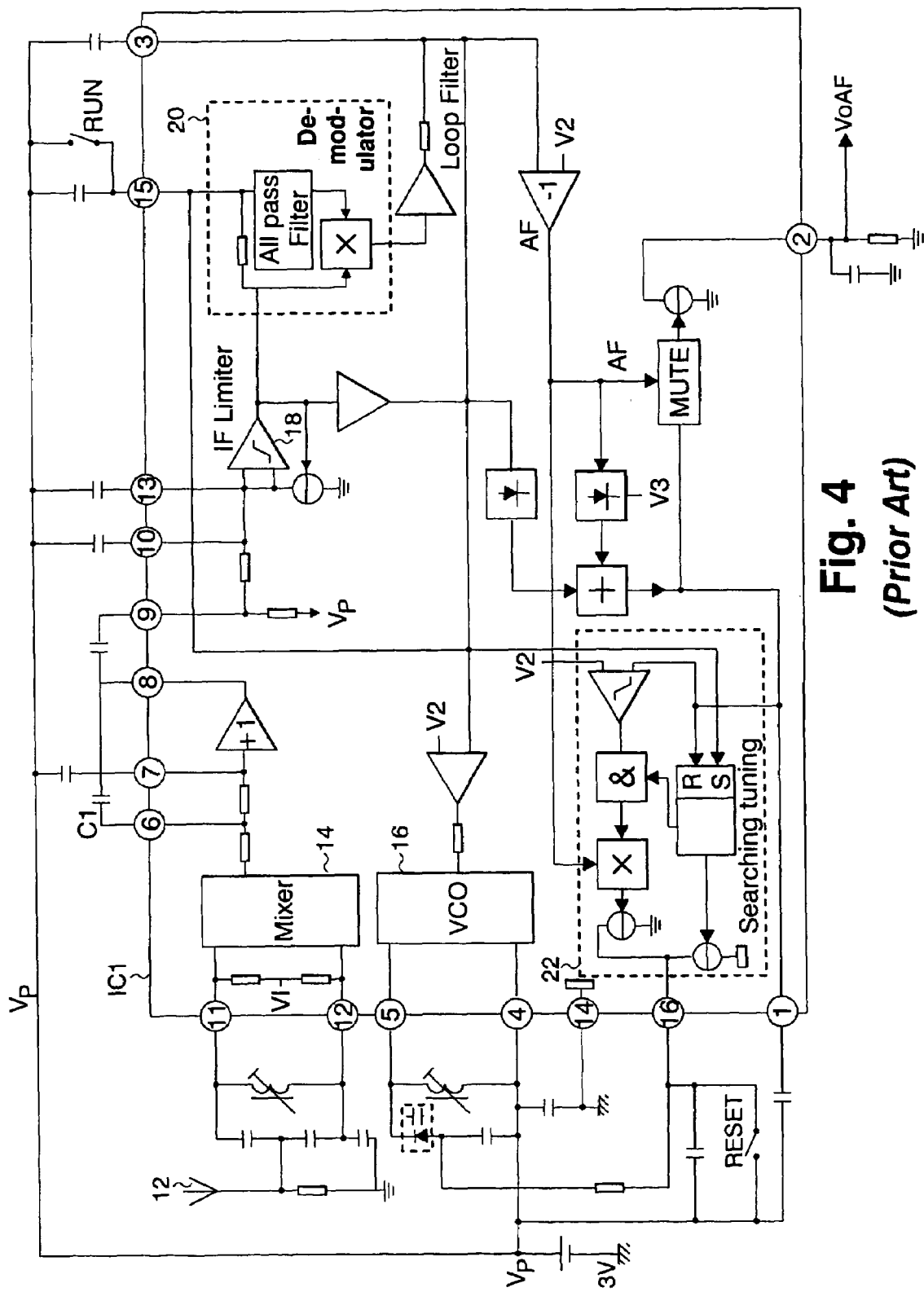
FIG. 4 is a block diagram of a prior art integrated circuit FM radio with a forward scan search tuning circuit.

There are a plurality of IC FM radios having the forward (band-up) scan function available in the marketplace. Known FM radio chips include the TDA7088T, manufactured by Philips Semiconductors (The Netherlands), and the SC1088, manufactured by Hangzhou Silan Microelectronics Joint-Stock Co., Ltd. (Taiwan). FIG. 4 illustrates the internal configuration of the SC1088, and is also representative of the TDA7088T internal layout. The SC1088 and TDA7088T are each bipolar technology integrated circuits used for mono-channel portable radios. Each circuit comprises a frequency-lock-loop (FLL) system having an intermediate frequency of about 70 KHz. Selectivity is obtained from an active RC filter. De-tuning related to the intermediate frequency circuitry, and extra weak input signals are suppressed in a mute circuit.

For both these IC FM radios, electrical tuning is realized by a uni-directional (band-up) tuning function. The scanning circuit fast tunes the receiver and results in a very small waiting time for the radio to find the next higher occupied frequency. Once the scanning circuit reaches the 108 MHz upper band limit, a user must press "reset" to tune the radio back to the 88 Mhz lower end of the band. The frequency-lock-loop circuitry of these IC FM radios does not automatically wrap-around to the lower end of the band as a phase-lock-loop type of circuit would.

The prior art IC FM radios can be incorporated into an embodiment of an electronic circuit having reverse scan tuning capability by including a series connected resistor Rr and a switch in parallel with a capacitor connected to the FM radio's electrical tuning AFC output. Preferably, the resistor Rr has a value of about 10 M ohms. Additionally, one end of a second switch is connected to the input of the IF limiter amplifier, and the switch's other end is connected to either ground or the positive terminal of the power supply.

Figure 1:
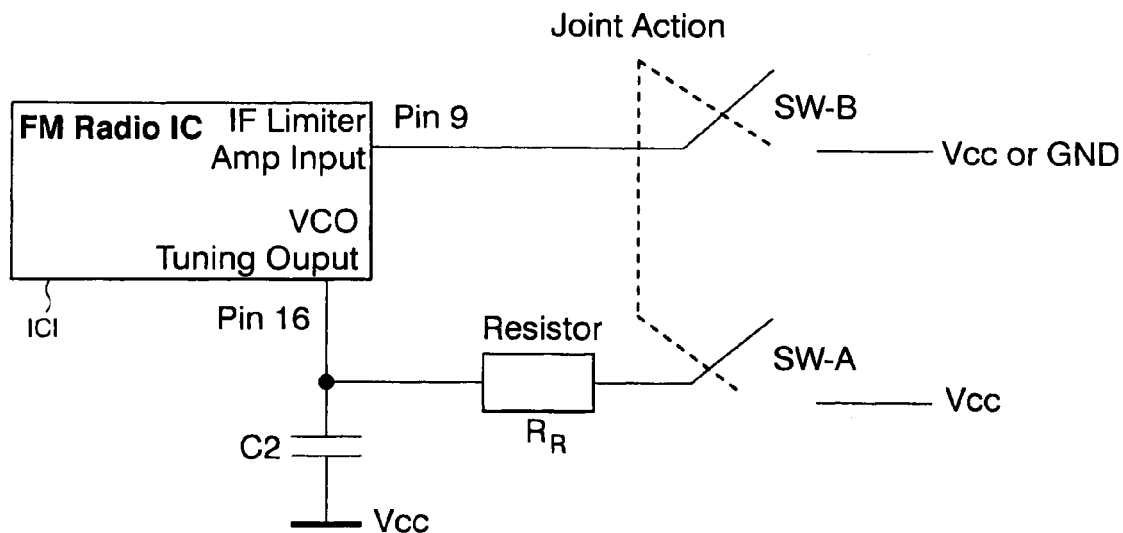
FIG. 1 is a schematic representation of an embodiment of the invention.
Figure 2:
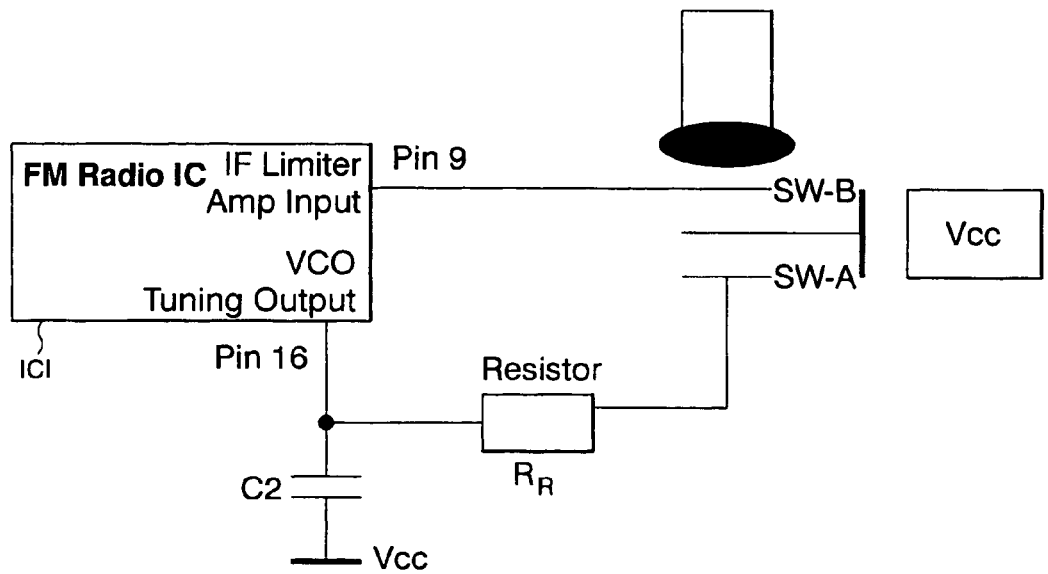
FIG. 2 is a schematic representation of another embodiment of the invention.

FIGS. 1 and 2 illustrate embodiments of a reverse scan electronic circuit incorporating the prior art integrated circuit FM radio IC1. FIG. 1 depicts a double-pole single throw switch which, when operated by a user, implements a reverse scan function in the IC FM radio. Similarly, FIG. 2 depicts an embodiment of the invention where a double-pole pushbutton switch is used in place of the single throw switch. While a user depresses the pushbutton switch, the IC FM radio performs a reverse scan function. In both embodiments, corresponding switch poles are labeled with like identifiers, i.e., SW-A and SW-B. Closure of the switch causes the VCO tuning output to reach Vcc, while simultaneously muting the detector output by connecting the IF limiter amplifier input of the IC FM radio to either ground or VCC. Switches SW-A and SW-B can be mechanical switches or solid state switches.

Figure 3:
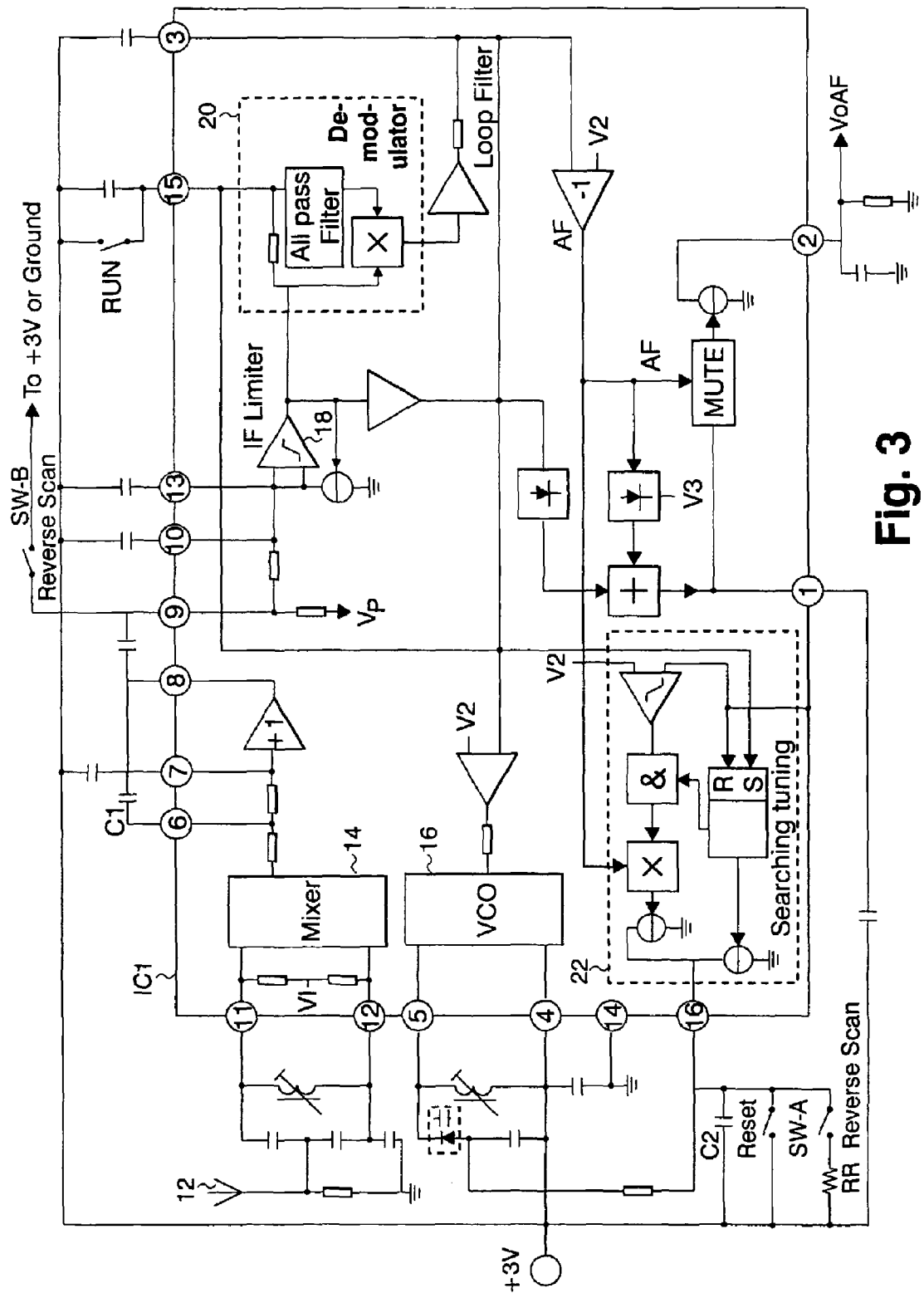
FIG. 3 is illustrates a circuit embodying the present invention.

FIG. 3 illustrates an embodiment of the electronic tuning circuit with reverse scanning. RF signals are received at the antenna 12 and fed to a front-end amplifier and mixer 14, which synchronizes the Voltage Control Oscillator (VCO) 16 to generate signals that are about 70 KHz higher than the received RF signals. The output signals from the mixer comprise a 70 KHz. component and are supplied to an intermediate frequency limiter 18 and filter 20. The VCO frequency is determined by the charge voltage of capacitor C1. As capacitor C1 charges, the radio's tuned frequency increases until an RF signal is received. To obtain the optimal received signal, a control signal from the IF stage pauses the scan and signals the Automatic Frequency Control (AFC) circuit 22 to begin tuning the VCO frequency slightly to lock-in the received frequency. Depressing the reset button shorts VCO capacitor C2 and causes the scan circuitry to jump to the lowest end of the frequency band.

Switches SW-A and SW-B are either ganged together in one embodiment depicted in FIG. 1, or are simultaneously depressed in a second embodiment depicted in FIG. 2. Closure of switches SW-A and SW-B reduces the intermediate frequency of the mixer and lowers the tuned receiving frequency. Closure of these switches cuts off the FLL and AFC functions. While the capacitor C2 is charging, the voltage of the capacitor is increasing, and the received frequency is decreasing. When the capacitor C2 stops charging, the voltage of the capacitor stops at a particular value corresponding to a frequency. Releasing switches SW-A and SW-B enables the detector and triggers the IC to search up-band from its presently tuned frequency. When the voltage of capacitor C2 is equal to the power supply voltage of the IC, the reverse scan functions ceases at the lowest frequency in the band. From this position, a user can search up-band using the forward searching capability of the IC FM radio.

For example, while scanning in reverse, when switches SW-A and SW-B are released, the IC ceases to reverse scan and comes to rest at some frequency. Perhaps the IC scan comes to rest at 98.0 MHz, and 98.5 MHz is the nearest up-band frequency. After release of switches SW-A and SW-B, the IC will begin to forward search and arrive at the 98.5 MHz station.

While embodiments have been described implementing reverse scan electronic tuning circuitry with the SC1088 and TDA7088T IC FM radios, the invention is not so limited. As will be understood by a person of skill in the art, the invention can be applied to any IC FM radio having forward scan function, with modifications to the circuit structure to achieve the reverse scan function for that particular IC FM radio.

Thus, while there have been shown, described, and pointed out fundamental novel features of the invention as applied to several embodiments, it will be understood that various omissions, substitutions, and changes in the form and details of the illustrated embodiments, and in their operation, may be made by those skilled in the art without departing from the spirit and scope of the invention. Substitutions of elements from one described embodiment to another are also fully intended and contemplated. The invention is defined solely with regard to the claims appended hereto, and equivalents of the recitations therein.

I claim:

1. An electronic circuit for implementing reverse scan tuning, comprising:
    a monolithic integrated circuit radio;
    a capacitor disposed between, and coupling together, a voltage power source and an automatic frequency control output of the integrated circuit;
    a series connected resistor and first switch connected in parallel across the capacitor; and
    a second switch disposed between, and coupling together, one of circuit ground and the voltage power source with an intermediate frequency limiter amplifier input of the integrated circuit.

2. The electronic circuit of claim 1, wherein the first switch and the second switch are corresponding poles of a double pole switch.

3. The electronic circuit of claim 2, wherein the double pole switch is a single throw switch.

4. The electronic circuit of claim 2, wherein the double pole switch is a pushbutton switch.

5. The electronic circuit according to claim 1, wherein the first switch and the second switch are solid state switches.

6. The electronic circuit according to claim 1, wherein the resistor has a value of about 10 M Ohms.

7. The electronic circuit of claim 1, wherein the integrated circuit radio includes circuitry for implementing a forward scan function.

8. The electronic circuit of claim 1, wherein the integrated circuit radio is an FM radio.

9. The electronic circuit of claim 1, wherein the integrated circuit radio is an AM radio.

10. The electronic circuit of claim 1, wherein the integrated circuit radio is an AM/FM radio.

* * * * *